(12) United States Patent
Hishida

(10) Patent No.: US 7,524,728 B2
(45) Date of Patent: Apr. 28, 2009

(54) THIN FILM TRANSISTOR MANUFACTURING METHOD AND ORGANIC ELECTROLUMINESCENT DISPLAY DEVICE

(75) Inventor: Mitsuoki Hishida, Kaizu (JP)

(73) Assignee: Sanyo Electric Co., Ltd., Osaka (JP)

( * ) Notice: Subject to any disclaimer, the term of this patent is extended or adjusted under 35 U.S.C. 154(b) by 401 days.

(21) Appl. No.: 11/267,585

(22) Filed: Nov. 7, 2005

(65) Prior Publication Data
US 2006/0108938 A1    May 25, 2006

(30) Foreign Application Priority Data
Nov. 8, 2004 (JP) ............... 2004-323613

(51) Int. Cl.
*H01L 21/336* (2006.01)
*H01L 21/425* (2006.01)
*H01L 21/265* (2006.01)

(52) U.S. Cl. .................. 438/289; 438/517; 438/527
(58) Field of Classification Search ............... 438/151; 315/169.3
See application file for complete search history.

(56) References Cited

U.S. PATENT DOCUMENTS 6,734,635 B2 * 5/2004 Kunii et al. ............ 315/169.3
2004/0087067 A1 * 5/2004 Yoneda et al. ............ 438/148
2005/0064239 A1 * 3/2005 Takei ..................... 428/690
2006/0234410 A1 * 10/2006 Chen ........................ 438/45

FOREIGN PATENT DOCUMENTS

JP     2002-175029     6/2002

* cited by examiner

*Primary Examiner*—Ha Tran T Nguyen
*Assistant Examiner*—Valerie Brown
(74) *Attorney, Agent, or Firm*—Morrison & Foerster LLP

(57) ABSTRACT

The invention reduces display unevenness of a horizontal streak and a vertical streak of an organic EL display device to improve display quality. A silicon oxide film is deposited on a glass substrate by a plasma CVD method, and an amorphous silicon film is further deposited on the silicon oxide film by the plasma CVD method. Next, an excimer laser is irradiated to the amorphous silicon film for heating the film until the film melts and the film is crystallized to form a polysilicon film. Then, this polysilicon film is etched in a predetermined pattern. After then, a p-type impurity, for example, boron is ion-implanted in the polysilicon film. Then, a gate insulation film formed of a silicon oxide film is deposited by a CVD method, covering the polysilicon film. Next, a gate electrode is formed on the gate insulation film.

8 Claims, 5 Drawing Sheets

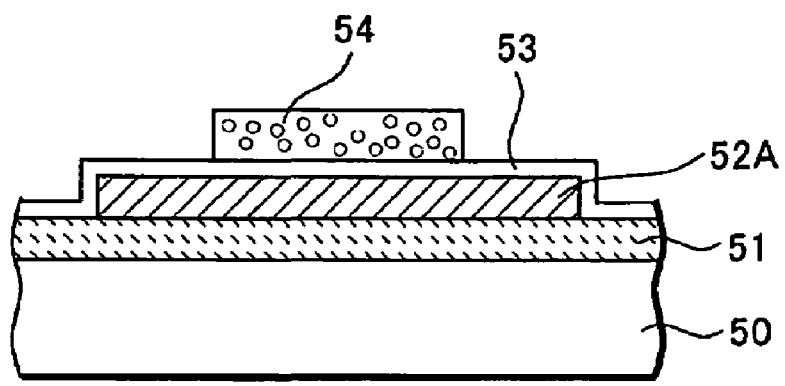
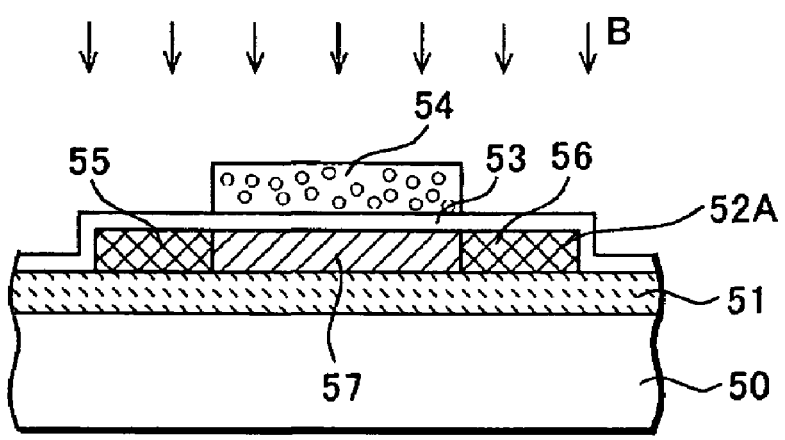
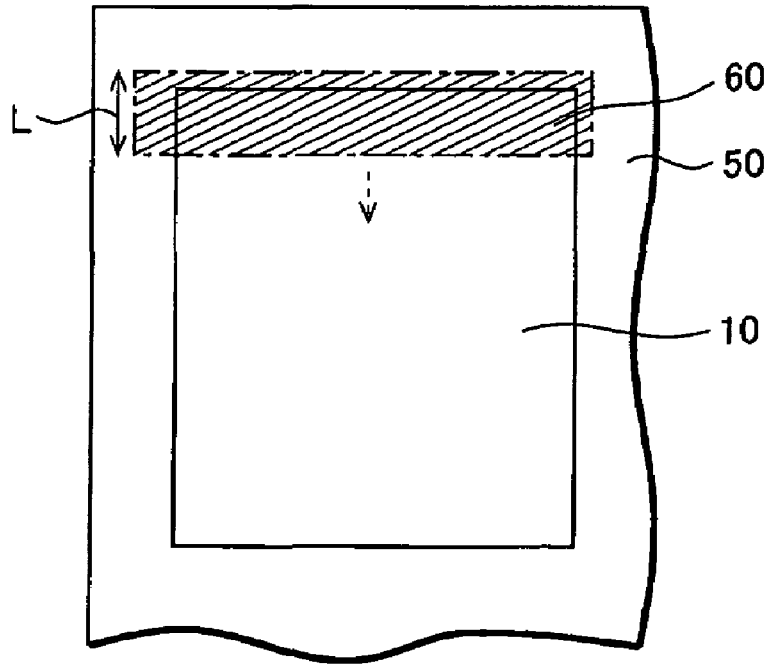

THIN FILM TRANSISTOR MANUFACTURING METHOD AND ORGANIC ELECTROLUMINESCENT DISPLAY DEVICE

CROSS-REFERENCE OF THE INVENTION

This invention is based on Japanese Patent Applications No. 2004-323613 and 2005-302700 the content of which is incorporated by reference in its entirety.

BACKGROUND OF THE INVENTION

1. Field of the Invention

The invention relates to a thin film transistor manufacturing method and an organic EL display device. This thin film transistor manufacturing method can be applied to a manufacturing method of a driving transistor of an organic electroluminescent element, for example.

2. Description of the Related Art

In recent years, an organic electroluminescent (hereafter, referred to as EL) display device with an organic EL element has been gathering attention as a display device replacing a CRT and an LCD. Particularly, the development efforts for the organic EL display device with a thin film transistor (referred to as TFT, hereafter) as a switching element for driving the organic EL element has been made accordingly.

An equivalent circuit diagram of an organic EL display panel 300 is shown in FIG. 8. A plurality of gate signal lines 11 supplying a gate signal and a plurality of drain signal lines 12 supplying a display signal Vsig are crossing each other. Pixels are disposed at intersections of both the signal lines, forming a display screen 10. Each of the pixels includes a pixel selecting TFT 13, an organic EL element 14, a driving TFT 15 driving this organic EL element 14, and a storage capacitor 16 temporarily storing the display signal Vsig.

A gate of the pixel selecting TFT 13 is connected with the gate signal line 11 and supplied with a gate signal, and a drain thereof is connected with the drain signal line 12 and supplied with a display signal Vsig. A source of the pixel selecting TFT 13 is connected with a gate of the driving TFT 15. The gate signal is outputted from a vertical drive circuit 30. The display signal Vsig is supplied through a horizontal drive circuit 20.

A source of the driving TFT 15 is supplied with a positive potential PVdd, and a drain thereof is connected with an anode of the organic EL element 14. A cathode of the organic EL element 14 is supplied with a negative potential CV.

An operation of the organic EL display device having the above-described structure will be described. When a gate signal becomes high level for a horizontal period, the pixel selecting TFT 13 turns on. Then, a display signal Vsig is applied from the drain signal line 12 to the gate of the driving TFT 15 through the pixel selecting TFT 13.

Then, the conductance of the driving TFT 15 changes in response to the display signal Vsig supplied to the gate, a corresponding amount of drive current is supplied to the organic EL element 14 through the driving TFT 15, and the organic EL element 14 turns on a light. When the driving TFT 15 turns off in response to a display signal supplied to the gate, an electric current does not flow in the driving TFT 15, so that the organic EL element 14 turns off the light.

The relevant technology is disclosed in the Japanese Patent Application Publication No. 2002-175029.

In the described organic EL display panel 300, however, as shown in FIG. 7, there has been a problem that a horizontal streak (a streak pattern in a horizontal direction on the screen) or a vertical streak (a streak pattern in a vertical direction on the screen) appears on the display screen 10 as display unevenness, or "mura" as known in the art.

The inventor founds that a cause of the appearance of the horizontal streak or the vertical streak on the display screen 10 is variation in the drive current driving the organic EL element 14 among the driving TFTs 15, and such variation in the drive current occurs by variation in energy of excimer laser irradiation within the display screen 10, which is performed when an amorphous silicon film forming the driving TFT 15 is crystallized.

SUMMARY OF THE INVENTION

The invention provide a method of manufacturing a thin film transistor. The method includes depositing an amorphous silicon film on a substrate, performing a laser irradiation to the amorphous silicon film so the amorphous film is melted and crystallized to form a polysilicon film, etching the polysilicon film to form a predetermined pattern, implanting impurities in the polysilicon film, forming a gate insulation film on the polysilicon film, forming a gate electrode on the gate insulation film, and forming a source region and a drain region in the polysilicon film.

The invention also provides an organic electroluminescent display device having a plurality of pixels arranged in a matrix on a substrate. Each of the pixels includes a pixel selecting thin film transistor, an organic electroluminescent element, and a driving thin film transistor driving the organic electroluminescent element in response to a display signal supplied through the pixel selecting thin film transistor. The driving thin film transistor includes a channel region that contains impurities of a p-type impurity and an n-type impurity.

BRIEF DESCRIPTION OF THE DRAWINGS

FIGS. 2A and 2B are cross-sectional views showing the thin film transistor manufacturing method of the invention.

FIG. 3 is a plan view showing the thin film transistor manufacturing method of the invention.

DETAILED DESCRIPTION OF THE INVENTION

An embodiment of the invention will be described with reference to figures. FIGS. 1A, 1B, 1C, 1D, 2A, and 2B are cross-sectional views showing a thin film transistor manufacturing method of the invention. In this embodiment, the thin film transistor is a driving transistor (P-channel type) of an organic EL element in an organic EL display panel 300 described above.

Figure 1A:
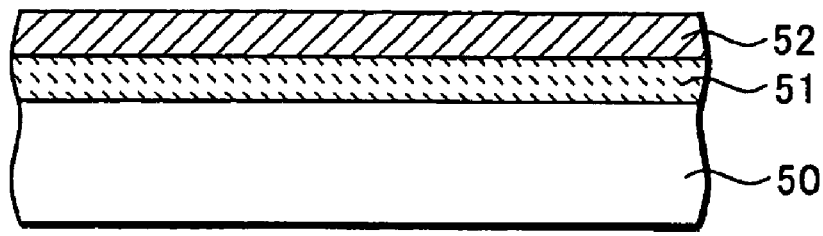
FIGS. 1A, 1B, 1C, and 1D are cross-sectional views showing a thin film transistor manufacturing method of the invention.

First, as shown in FIG. 1A, a silicon oxide film 51 is deposited on a glass substrate 50 by a plasma CVD method, and an amorphous silicon film 52 is further deposited on the silicon oxide film 51 by the plasma CVD method so as to have a thickness of about 43 nm.

Then, the amorphous silicon film 52 is heated to 430° C. (±20° C.) together with a glass substrate 50, and this heat treatment is continued for one hour or more. By this heat treatment, about 10% of hydrogen in the amorphous silicon film 52 is reduced to 1% or less.

Then, the amorphous silicon film 52 is irradiated with an excimer laser to heat the amorphous silicon film 52 until the film 52 melts. At this time, since hydrogen contained in the amorphous silicon film 52 is already reduced largely compared with when deposited, the hydrogen is not rapidly released to the outside of the film 52 when silicon melts. By this process, the silicon is crystallized without damaging its surface to form a polysilicon film 52A.

An excimer laser irradiation method in this process will be described with reference to FIG. 3. A pixel region to be a display screen 10 having a plurality of pixels arrayed in a matrix of rows and columns is determined on the glass substrate 50. An irradiation region 60 to be irradiated with a shot of excimer laser is shown by a hatched rectangular region in FIG. 3, and a plurality of pixels is included therein. The structure of the pixel is the same as the one described with reference to FIG. 6. A length L of the irradiation region 60 is several 100 micrometers.

After one shot irradiation, the irradiation region 60 is shifted in a column direction by a pitch of several 10 micrometers, and a shot of excimer laser is irradiated there, too. By repeating the one shot irradiation and the shift of the irradiation region 60 from one edge to another edge of the pixel region to be the display screen 10, the excimer laser irradiation is completed over the amorphous silicon film 52 in the pixel region.

Figure 1B:
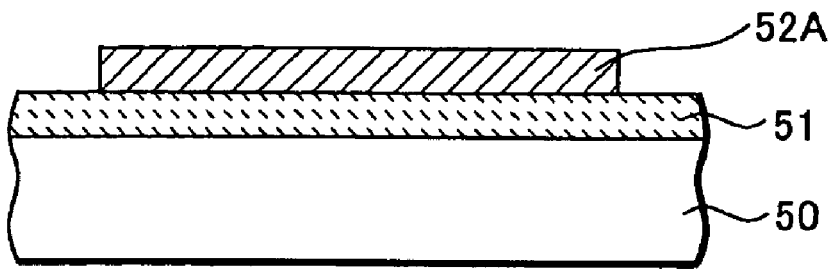
Figure 1C:
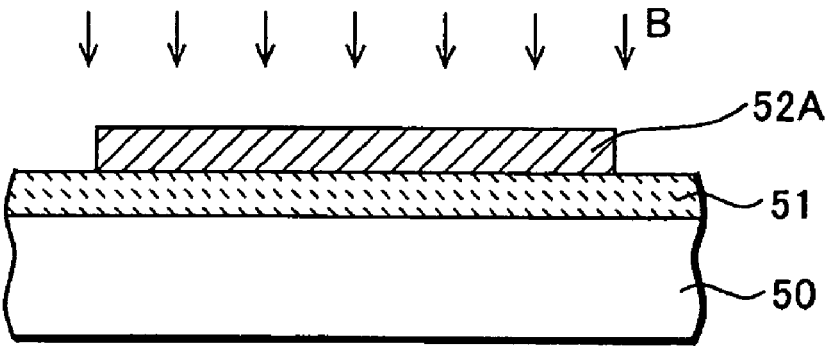

Next, as shown in FIG. 1B, the polysilicon film 52A is etched in a predetermined pattern. Then, as shown in FIG. 1C, a p-type impurity, for example, boron (B) is ion-implanted in the polysilicon film 52A. This process is the most characteristic feature of the invention. Although the details will be described below, this implantation of the impurity can reduce display unevenness of a horizontal streak and a vertical streak on the display screen of the organic EL display panel. It is experimentally proved that an n-type impurity such as phosphorous (P) implanted in the polysilicon film 52A also has the effect of reducing the display unevenness, and both the p-type impurity and the n-type impurity ion-implanted in the polysilicon film 52A also have the effect of reducing the display unevenness.

Although, an impurity is ion-implanted in the polysilicon film 52A after the polysilicon film 52A is etched in a predetermined pattern in the above-described process, it is possible that the polysilicon film 52A is etched in the predetermined pattern after the impurity is ion-implanted in the polysilicon film 52A, contrarily.

Figure 1D:
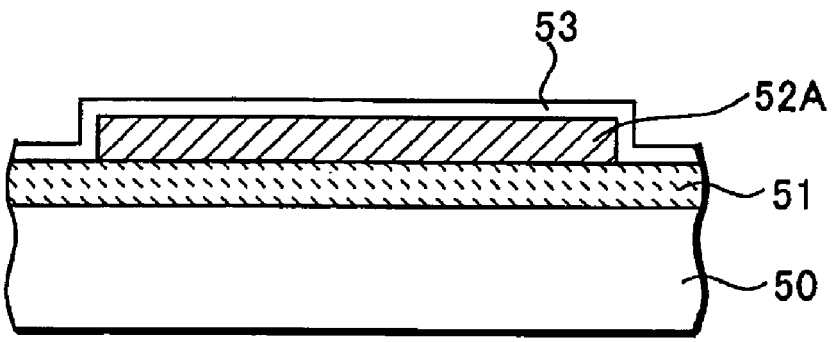

Next, as shown in FIG. 1D, a gate insulation film 53 formed of a silicon oxide film is deposited covering the polysilicon film 52A by a CVD method. Then, as shown in FIG. 2A, a gate electrode 54 formed of molybdenum and so on is formed on the gate insulation film 53. Then, as shown in FIG. 2B, a high concentration of p-type impurity such as boron is ion-implanted in the polysilicon film 52A by using the gate electrode 54 as a mask to form a source region 55 and a drain region 56. The polysilicon film 52A between the source region 55 and the drain region 56 serves a channel region 57.

Figure 4:
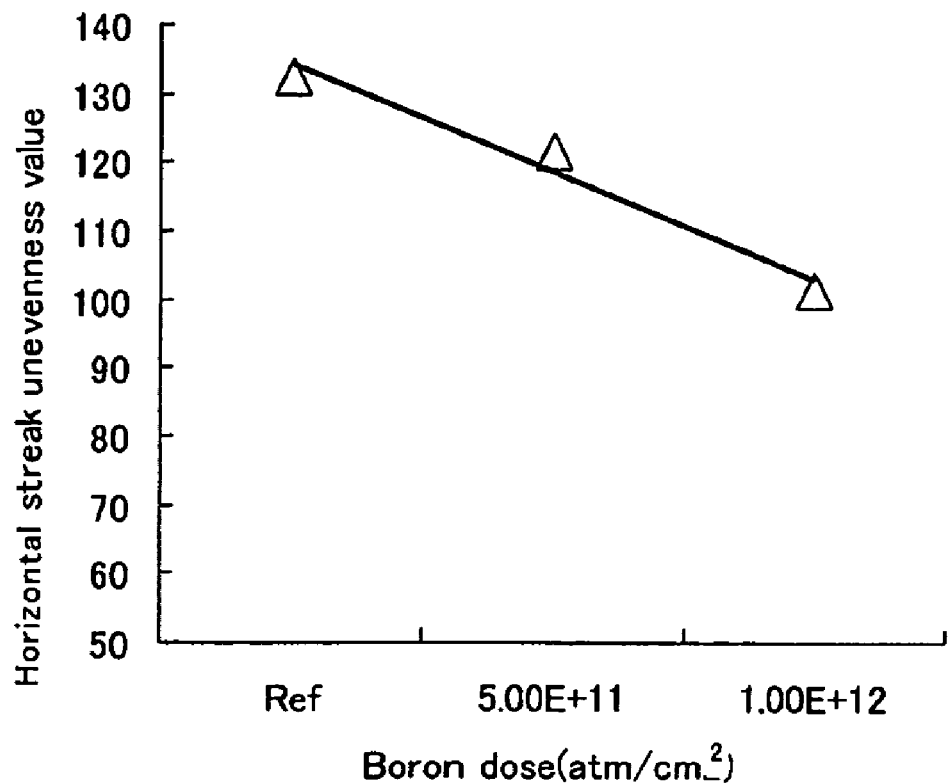
FIG. 4 is a graph showing a relation between a horizontal streak unevenness value and a boron dose.

Next, description will be made on a result of an experiment in an effect of the ion-implantation to the polysilicon film 52A. FIG. 4 shows a relation between a horizontal streak unevenness value and a boron dose. The horizontal streak unevenness value means an index of a degree of appearance of the horizontal streak on the display screen of the organic EL display panel, and is measured by a commercial measuring device, "Eye System" (a product from Eye System Corporation). The less the horizontal streak unevenness value is, the less the horizontal streak is. As apparent from FIG. 4, there is an effect of reducing the horizontal streak unevenness value even with a small dose of $5\times10^{11}$ atm/cm$^2$, and the horizontal streak unevenness value reduces according as the boron dose increases. The horizontal streak unevenness value in the case of no boron doping is 132.5, while the horizontal streak unevenness value in the case of $1\times10^{12}$ atm/cm$^2$ of boron doping is reduced to 101.2, providing an improvement effect of 23.6%.

Figure 5:
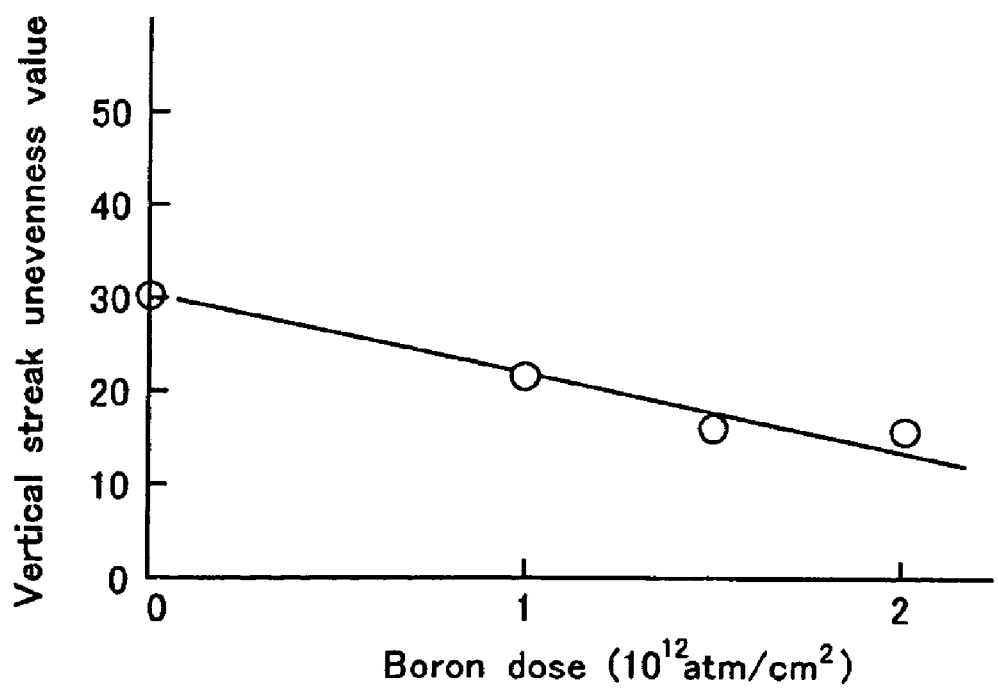
FIG. 5 is a graph showing a relation between a vertical streak unevenness value and a boron dose.

FIG. 5 shows a relation between a vertical streak unevenness value and a boron dose. The vertical streak unevenness value means an index of a degree of appearance of the vertical streak on the display screen of the organic EL display panel, and is also measured by the "Eye system". The less the vertical streak unevenness value is, the less the vertical streak is. As apparent from FIG. 5, the vertical streak unevenness value reduces according as the boron dose increases. The vertical streak unevenness value in the case of no boron doping is 30.6, while the vertical streak unevenness value in the case of $1.5\times10^{12}$ atm/cm$^2$ of boron doping is reduced to 15.9, providing an improvement effect of 48.07%.

Figure 6:
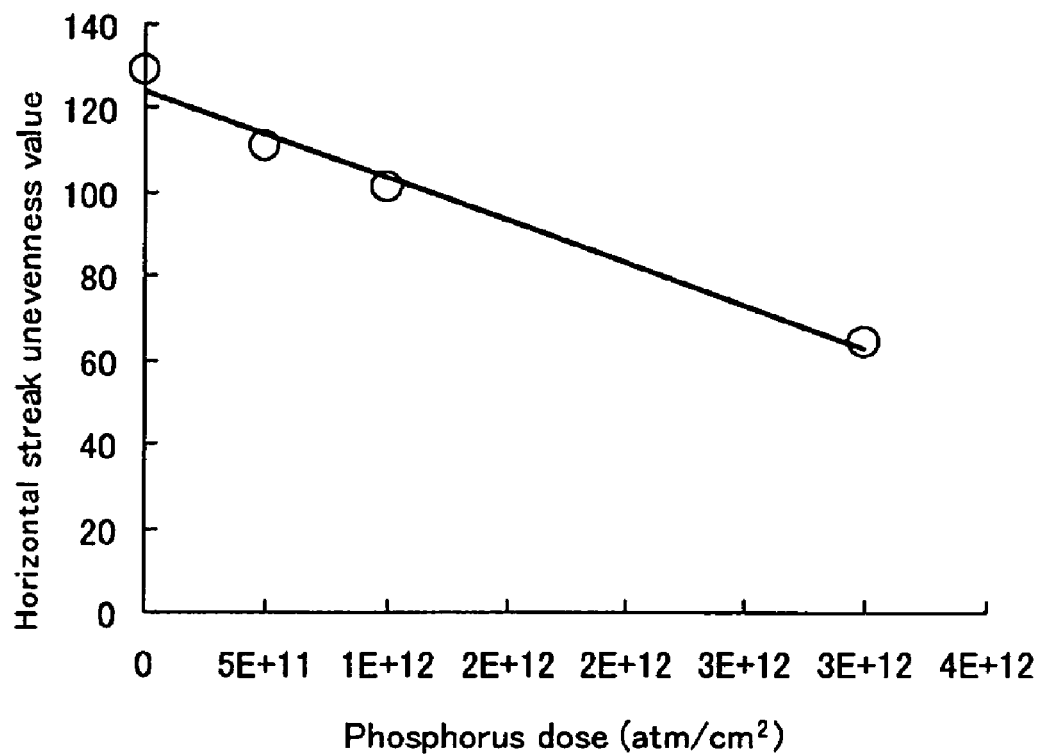
FIG. 6 is a graph showing a relation between a horizontal streak unevenness value and a phosphorus dose.

Furthermore, it was found that the horizontal streak unevenness value and the vertical streak unevenness value reduce by ion-implantation of phosphorous or ion-implantation of phosphorous and boron, too. FIG. 6 shows a relation between the horizontal streak unevenness value and a phosphorus dose. As apparent from FIG. 6, the horizontal streak unevenness value reduces according as the phosphorus dose increases. The horizontal streak unevenness value in the case of no phosphorus doping is 128.8, while the horizontal streak unevenness value in the case of $1\times10^{12}$ atm/cm$^2$ of phosphorus doping is reduced to 101.2. Furthermore, the horizontal streak unevenness value in the case of $3\times10^{12}$ atm/cm$^2$ of phosphorus doping is 64.1, providing an improvement effect of 50%.

Figure 7:
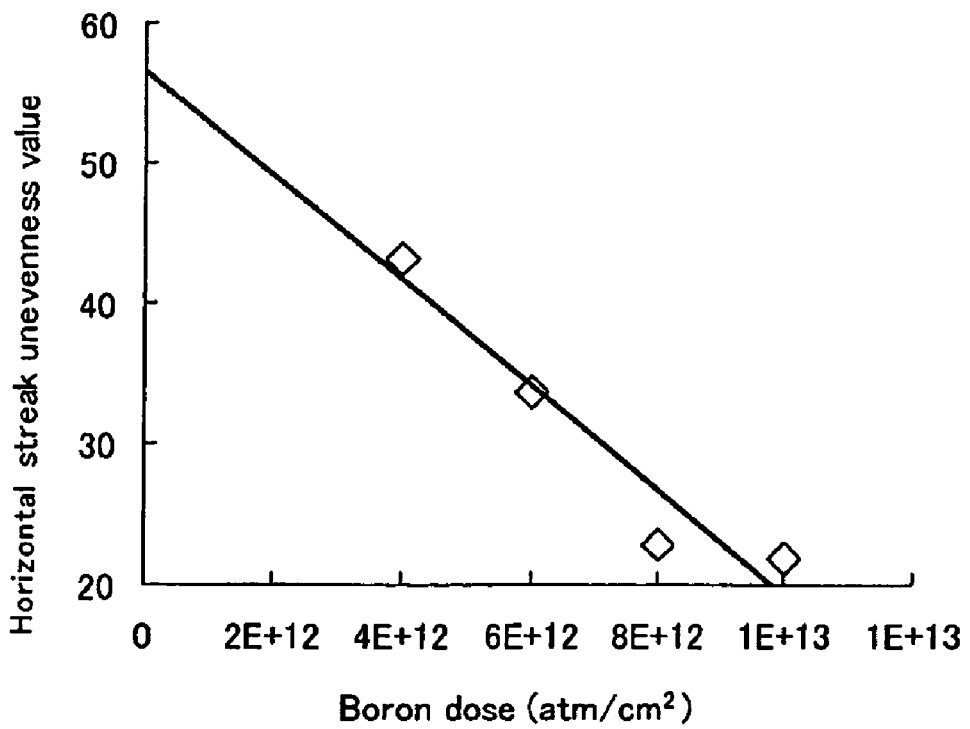
FIG. 7 is a graph showing a relation between a horizontal streak unevenness value and a boron dose.
Figure 8:
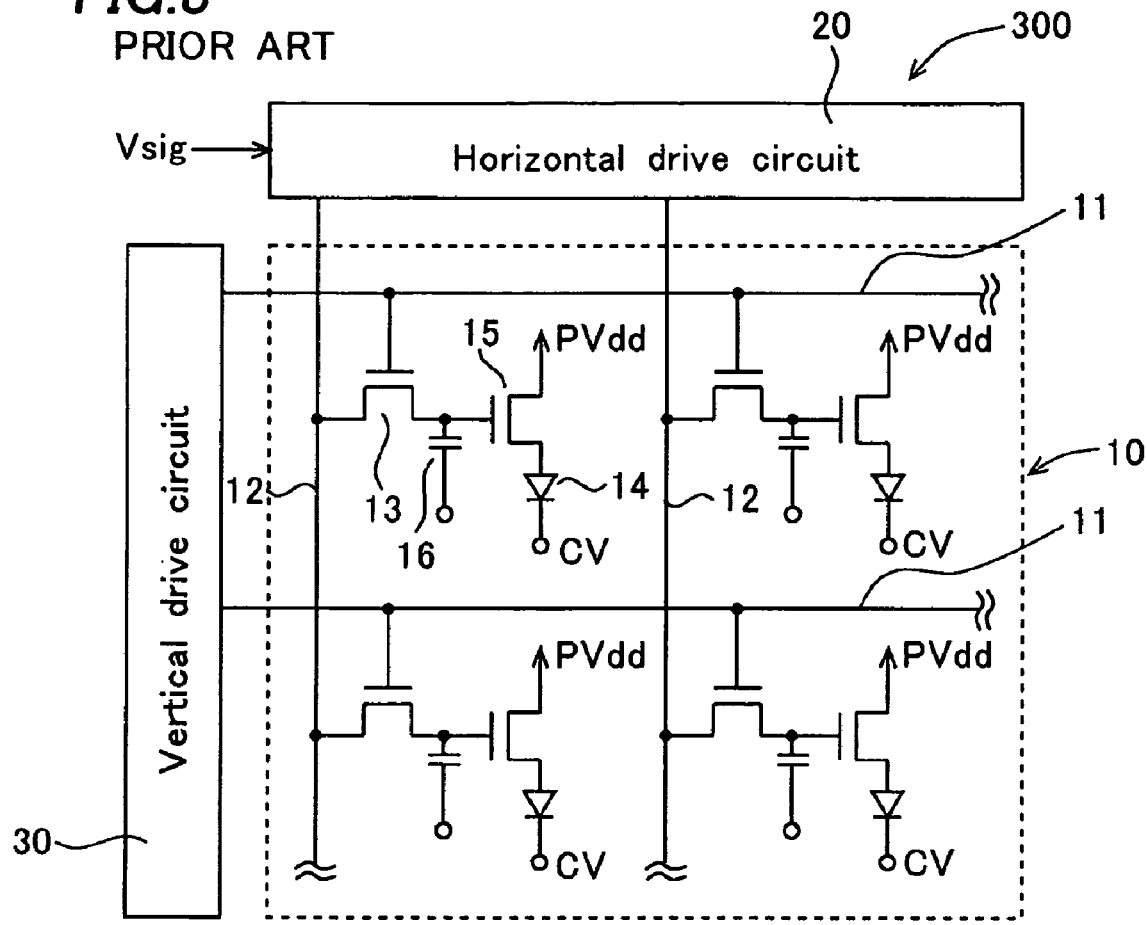
FIG. 8 is an equivalent circuit diagram of an organic EL display panel.
Figure 9:
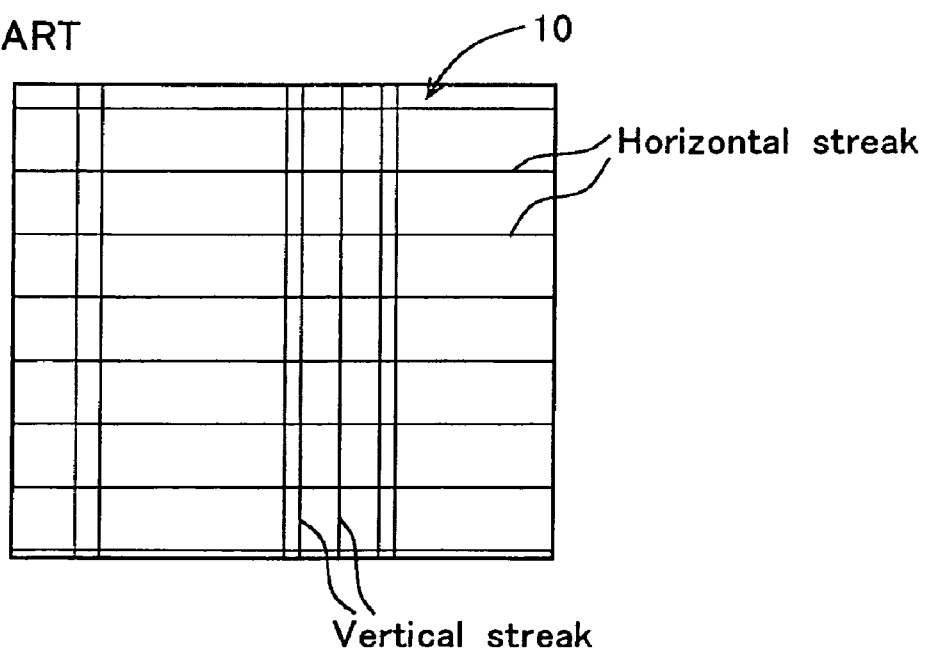
FIG. 9 is a view showing horizontal streaks and vertical streaks appearing on the organic EL display panel.

FIG. 7 shows a relation between the horizontal streak unevenness value and a boron dose. Compared with the experiment of FIG. 4, the boron dose is increased to $1\times10^{13}$ atm/cm$^2$. It may be seen that FIGS. 4 and 7 do not correspond with each other with the same dose, but this is because each of the experiments is performed using a panel extracted from a different lot. As apparent from FIG. 7, the horizontal streak unevenness value reduces according as the dose increases, but the change is little between $8\times10^{12}$ atm/cm$^2$ and $1\times10^{13}$ atm/cm$^2$. It can be expected that the horizontal streak unevenness value does not largely reduce even when the dose is increased more than $1\times10^{13}$ atm/cm$^2$. Furthermore, it can be expected that the increase of the boron dose changes the threshold voltage of the thin film transistor to affect the operation of the organic EL display panel, but it is confirmed that the organic EL display panel operates properly when the boron dose is $1\times10^{13}$ atm/cm$^2$ or less. It is noted that the boron is diluted with hydrogen (H$_2$) to 1% concentration, and the phosphorous is diluted with hydrogen (H$_2$) to 0.5% concentration in the described experiments.

On the other hand, by ion-implanting both phosphorous and boron in the polysilicon film 52A, the change of the threshold voltage can be compensated. Therefore, the dose of the ion-implantation can be increased, so that the horizontal streak unevenness value and the vertical streak unevenness value can be reduced with minimizing the change of the threshold voltage. For example, by ion-implanting $3\times10^{12}$ atm/cm$^2$ of boron and $2.5\times10^{12}$ atm/cm$^2$ of phosphorus, the reduction effect of the horizontal streak unevenness value becomes 51.7%, and the reduction effect of the vertical streak unevenness value becomes 50.7%, providing a larger effect than in the ion-implantation of phosphorous or boron only.

The implantation of the p-type or n-type impurity in the polysilicon film 52A can thus reduce the display unevenness of the horizontal streak and the vertical streak, and its physical mechanism is as follows. The excimer laser irradiation is performed over the amorphous silicon film 52 and the amorphous silicon film 52 is crystallized to form the polysilicon film 52A, as described above. At this time, since spatial variation occurs in the energy of the excimer laser (variation in row and column directions on the display screen), the grain size of the channel region 57 of the thin film transistor and the height of the potential barrier of the crystal grain boundary differ among pixels.

In the channel current flowing in the thin film transistor, the higher the potential barrier of the crystal grain boundary is, the more the free electron trapped in the crystal grain boundary is and the less the channel current flows. For solving this, by implanting a donor impurity (n-type impurity) increasing the free electrons or an acceptor impurity (p-type impurity) trapping the free electrons in the channel region as in the embodiment, the heights of the potential barriers of the crystal grain boundaries are equalized, and the channel current flowing in the thin film transistors can be equalized.

What is claimed is:

1. A method of manufacturing a thin film transistor, comprising:
    depositing an amorphous silicon film on a substrate;
    performing a laser irradiation to the amorphous silicon film so the amorphous film is melted and crystallized to form a polysilicon film;
    etching the polysilicon film to form a predetermined pattern;
    implanting impurities in the polysilicon film;
    forming a gate insulation film on the polysilicon film;
    forming a gate electrode on the gate insulation film;
    forming a source region and a drain region in the polysilicon film; and
    configuring the thin film transistor to operate as a pixel driving transistor of an organic electroluminescent element,
    wherein the implanting of the impurities comprises implanting impurities of a p-type and impurities of an n-type into part of the polysilicon film to be used as a channel region of the driving transistor, and the implanting of the p-type impurity comprises implanting a dose of boron from $1\times10^{12}$ to $1\times10^{13}$ atm/cm$^2$ into the part of the polysilicon film to be used as the channel region of the driving transistor.

2. The method of claim 1, wherein the etching of the polysilicon film is performed prior to the implanting of the impurities.

3. The method of claim 1, wherein the etching of the polysilicon film is performed subsequent to the implanting of the impurities.

4. The method of claim 1, wherein the implanting of the impurities comprises implanting a dose of boron from $8\times10^{12}$ to $1\times10^{13}$ atm/cm$^2$.

5. The method of claim 1, wherein the dosage of the p-type impurity and a dosage of the n-type impurity are in the same order of magnitude.

6. An organic electroluminescent display device comprising a plurality of pixels arranged in a matrix on a substrate, each of the pixels comprising:
    a pixel selecting thin film transistor;
    an organic electroluminescent element; and
    a driving thin film transistor driving the organic electroluminescent element in response to a display signal supplied through the pixel selecting thin film transistor, the driving thin film transistor comprising a channel region that contains impurities of a p-type impurity and an n-type impurity.

7. The organic electroluminescent display device of claim 6, wherein a dosage of the p-type impurity and a dosage of the n-type impurity are in the same order of magnitude.

8. A method of manufacturing a thin film transistor, comprising:
    depositing an amorphous silicon film on a substrate; performing a laser irradiation on the amorphous silicon film so the amorphous film is melted and crystallized to form a polysilicon film; etching the polysilicon film to form a predetermined pattern; implanting impurities in the polysilicon film; forming a gate insulation film on the polysilicon film; forming a gate electrode on the gate insulation film; forming a source region and a drain region in the polysilicon film; and configuring the thin film transistor to operate as a pixel driving transistor of an organic electroluminescent element, wherein the implanting of the impurities comprises implanting impurities of p-type and impurities of n-type in to part of the polysilicon film to be used as a channel region of the driving transistor, and the implanting of the comprises implanting a dose of phosphorus from $1\times10^{12}$ to $3\times10^{12}$ atm/cm$^2$ into part of the polysilicon film to be used as a channel region of the driving transistor.

* * * * *